United States Patent
Gao et al.

(10) Patent No.: US 8,455,117 B2
(45) Date of Patent: Jun. 4, 2013

(54) BIT-PATTERNED STACK WITH ANTIFERROMAGNETIC SHELL

(75) Inventors: Kaizhong Gao, Eden Prairie, MN (US); Haiwen Xi, Prior Lake, MN (US); Song Xue, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 529 days.

(21) Appl. No.: 12/397,457

(22) Filed: Mar. 4, 2009

(65) Prior Publication Data

US 2010/0227202 A1    Sep. 9, 2010

(51) Int. Cl.
*H01L 29/82*    (2006.01)
*H01F 10/32*    (2006.01)
*G11B 5/74*    (2006.01)
*H01F 10/00*    (2006.01)
*H01L 21/02*    (2006.01)

(52) U.S. Cl.
CPC ........... *H01L 29/82* (2013.01); *H01L 21/02112* (2013.01); *G11B 5/746* (2013.01); *H01F 10/002* (2013.01)
USPC ........... 428/812; 428/826; 365/130; 365/145; 365/171

(58) Field of Classification Search
None
See application file for complete search history.

(56) References Cited

U.S. PATENT DOCUMENTS

| | | | |
|---|---|---|---|
| 7,147,916 B2 * | 12/2006 | Iwasaki et al. | 428/403 |
| 8,147,995 B2 * | 4/2012 | Xi et al. | 428/828 |
| 2007/0188942 A1 * | 8/2007 | Beach et al. | 360/324.2 |
| 2008/0014442 A1 * | 1/2008 | Rida | 428/403 |
| 2008/0085425 A1 | 4/2008 | Girt et al. | 428/826 |
| 2009/0047485 A1 | 2/2009 | Ofir et al. | 428/206 |
| 2009/0061259 A1 | 3/2009 | Lee et al. | 428/828 |
| 2009/0097152 A1 | 4/2009 | Gao et al. | 360/76 |
| 2010/0032777 A1 * | 2/2010 | Gao et al. | 257/421 |
| 2010/0033872 A1 * | 2/2010 | Xi et al. | 360/135 |
| 2010/0053822 A1 * | 3/2010 | Xi et al. | 360/324.2 |
| 2010/0102406 A1 * | 4/2010 | Xi et al. | 257/421 |

* cited by examiner

*Primary Examiner* — Kevin Bernatz
(74) *Attorney, Agent, or Firm* — Ladas & Parry, LLP (57) ABSTRACT

A method of producing bit-patterned media is provided whereby a shell structure is added on a bit-patterned media dot. The shell may be an antiferromagnetic material that will help stabilize the magnetization configuration at the remanent state due to exchange coupling between the dot and its shell. Therefore, this approach also improves the thermal stability of the media dot and helps each individual media dot maintain a single domain state.

18 Claims, 6 Drawing Sheets

BIT-PATTERNED STACK WITH ANTIFERROMAGNETIC SHELL

FIELD OF THE INVENTION

The present invention relates to the manufacture of magnetic disks and, more particularly, a unique construction of bit cells in bit-patterned media.

BACKGROUND OF THE INVENTION

Hard disk drives have developed as an efficient and cost effective solution for data storage. Since the introduction of the first magnetic disk drive, storage density capabilities have increased by eight fold, with an average steady increase of nearly fifty percent per year. Main stream technology has consisted of storing information on continuous granular media having out-of-plane anisotropy and being associated with a soft under layer which helps concentrate the magnetic flux underneath the write pole of the head, thus increasing the write field efficiency.

However, it is generally accepted that this technology will reach its limit at an areal density between 500 Gbit/in$^2$ and 1 Terabit/in$^2$. This limit is set by the so-called "recording trilemma" which is the difficulty to reconcile three requirements of magnetic recording technology: i) a sufficient number of grains per bit to insure a large enough signal to noise ratio, ii) a sufficient stability of the magnetization of each grain against thermal fluctuations, iii) the ability to switch the magnetization of the grain with the field available from the write head. Several solutions are under investigation to circumvent this trilemma, including Heat Assisted Magnetic Recording (HAMR), Microwave Assisted Magnetic Recording (MAMR), bit-patterned media, with combinations of these approaches also being possible.

Figure 1:
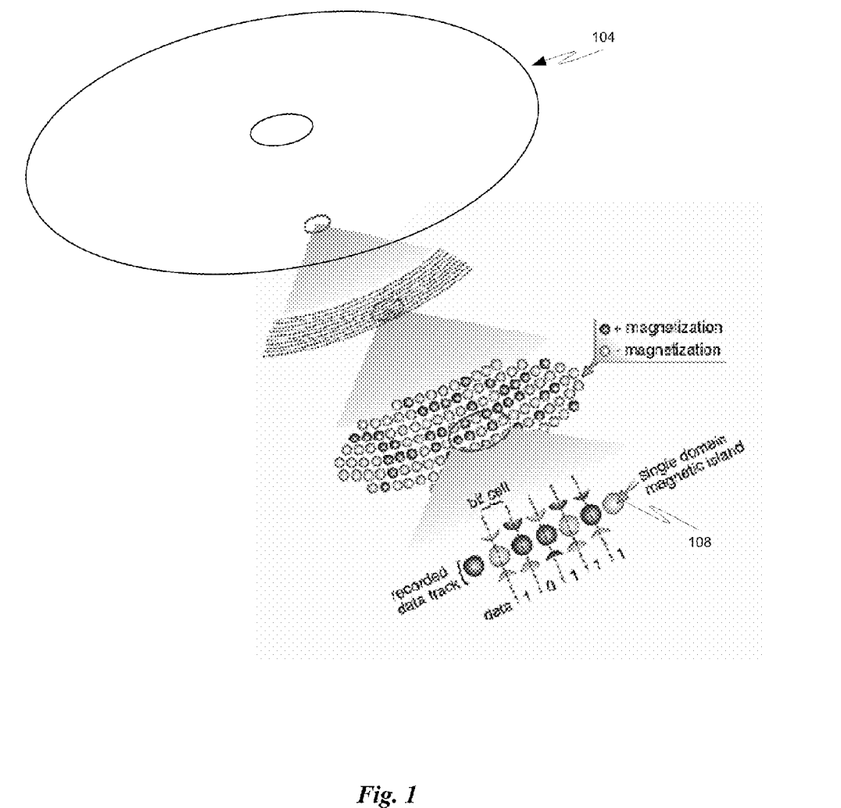
FIG. 1 is a perspective view of individual bit cells in a bit-patterned media.

Bit-patterned media, in particular, presents one of the most promising methods to overcome the density limitations imposed by the trilemma. In conventional media, the magnetic recording layer is a thin film of a magnetic alloy, which naturally forms a random mosaic of nanometer-scale grains that behave as independent magnetic elements. Each recorded bit is made up of many of these random grains. In bit-patterned media, on the other hand, the magnetic layer is created as an ordered array of highly uniform islands or dots, each dot being capable of storing an individual bit. FIG. 1 depicts an exemplary recording disk 104 comprising an array of magnetic dots 108. Each magnetic dot 108 is capable of storing a single bit of information.

One challenge associated with bit-patterned media is that it has been shown that magnetic moments at the edge of a magnetic dot 108 cause the dot 108 to become unstable at its boundaries, thereby decreasing the signal-to-noise ratio at the edge of the magnetic dot 108. The likelihood of disk malfunctions (e.g., read or write errors) increases as the signal-to-noise ratio of the dot decreases. In addition to affecting the signal-to-noise ratio and stability of stored data, the defect or the fluctuation at the dot 108 edge is also one of the primary sources of media switching field distributions. Therefore, with these convention bit-patterned media designs, the achievable areal density is sacrificed significantly.

SUMMARY OF THE INVENTION

These and other shortcomings of the prior art are addressed by embodiment of the present invention. More particularly, the present invention provides advantages over the prior art in that a shell structure is added to a bit-patterned media dot. The shell structure may comprise an antiferromagnetic (AFM) material to help stabilize the magnetization configuration at the remanent state due to exchange coupling between the core of the magnetic dot and the shell.

In accordance with at least some embodiments of the present invention, a bit is provided that includes a magnetic core and an antiferromagnetic shell. The shell is generally positioned around the edges of the core to help reduce/eliminate moments at the edge of the magnetic core. The magnetic core may comprise a magnetically hard material and the shell may comprise an antiferromagnetic material that facilitates a magnetic coupling between the magnetic core and the shell (e.g., due to an exchange bias) such that when the magnetic orientation of the magnetic core is altered (e.g., due to having a write head apply a magnetic field thereto) the magnetic orientation of the shell also alters.

In antiferromagnetic materials, the magnetic moments of atoms or molecules, usually related to the spins of electrons, align in a regular pattern with neighboring spins (on different sublattices) pointing in opposite directions. This is, like ferrimagnetism and ferromagnetism, a manifestation of ordered magnetism. Unlike ferromagnetism, antiferromagnetic materials do not have net magnetic moment.

Antiferromagnetic materials occur less frequently in nature than ferromagnetic ones. Examples of antiferromagnetic materials include, but are not limited to, metals such as chromium and palladium, alloys such as iron manganese ($Fe_{1-x}Mn_x$), nickel manganese ($Ni_{1-x}Mn_x$), platinum manganese ($Pt_{1-x}Mn_x$), and iridium manganese ($Ir_{1-x}Mn_x$) and oxides such as nickel oxide ($NiO_x$), cobalt oxide ($CoO_x$), and iron oxide ($FeO_x$), where x denotes that the composition may vary.

In accordance with at least some embodiments of the present invention, a method of manufacturing bit-patterned media is provided. The method generally includes providing a plurality of magnetic dots on a substrate and depositing an antiferromagnetic material around the plurality of magnetic dots. More specifically, the antiferromagnetic material may be provided around each of the magnetic dots to create an array of magnetic dots, each having an antiferromagnetic shell in accordance with embodiments of the present invention.

Each magnetic dot is adapted to store a single bit of data having two possible logical values (typically 1 or 0).

The above-described embodiments and configurations are not intended to be complete nor exhaustive. As will be appreciated, other embodiments of the invention are possible utilizing, alone or in combination, one or more features set forth above or described below.

BRIEF DESCRIPTION OF THE DRAWINGS

Several drawings have been developed to assist with understanding the invention. Following is a brief description of the drawings that illustrate the invention and its various embodiments.

It should be understood that the drawings are not necessarily to scale, and that in certain instances, the disclosure may not include details, which are not necessary for an understanding of the present invention, such as conventional details of fabrication and assembly, by those of skill in the art. Also, while the present disclosure describes the invention in connection with those embodiments presented, it should be understood that the invention is not strictly limited to these embodiments.

DETAILED DESCRIPTION

Figure 2A:
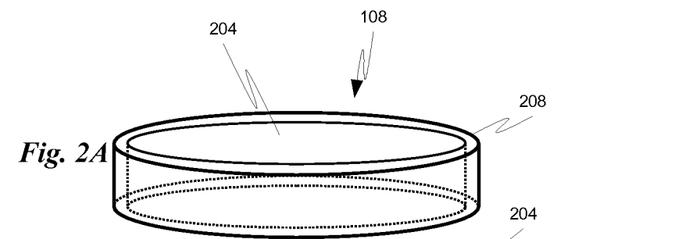
FIG. 2A is a perspective view showing various elements of a bit cell.
Figure 2B:
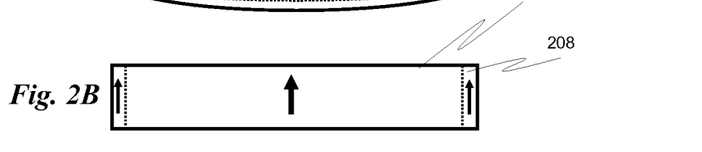
FIG. 2B is a cross-sectional view of a bit cell.
Figure 2C:
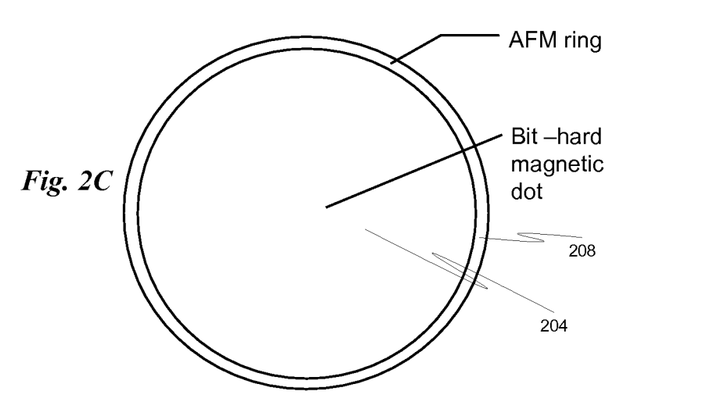
FIG. 2C is a top view of a bit cell.

With reference now to FIGS. 2A-2C, details of an exemplary bit 108 for use in bit-patterned media will be described in accordance with at least some embodiments of the present invention. The bit 108 may comprise a magnetic core or dot 204 surrounded by an antiferromagnetic shell 208. The core 204 may comprise a generally cylindrical arrangement.

The shell 208 may be provided outside of the core 204 and may comprise a hollow cylindrical arrangement. Accordingly, the overall arrangement of elements in the bit 108 may comprise a concentrically oriented core 204 and shell 208 and each element may be radially oriented about a common axis or at least substantially parallel axes. As can be appreciated by one skilled in the art, the shell 208 may be provided around all of just a portion of the core 204. In other words, the shell 208 may just form a perimeter wall around the core 204, leaving the top surface of the core 204 open, or the shell 208 may cover some portion or all of the top surface of the core 204 as well.

The core 204 may comprise a magnetically hard material. Magnetically hard materials can be permanently magnetized by a strong magnetic field. Steel and special alloys such as Alcomax, Alnico, and Ticonal, which contain various amounts of aluminum, nickel, cobalt, and copper, are some examples of a magnetically hard material that may be used as the core 204. Another example of a magnetically hard material that may be used in the core 204 is copper iron chromium. Examples of hard materials that can be included in the core 204 include, without limitation, CoCr, CoCrB, CoPt, CoPtB, CoPtBO, FePt, FePeCu, FePeCuB, FePeC, and their oxidization. The percentage of each material in the core 204 may vary depending upon certain design considerations.

The shell 208, on the other hand, may comprise an antiferromagnetic material. Examples of materials that may be used in the shell 208 include, without limitation, chromium, Palladium, NiMn, FeMn, PtMn, NiO, and possibly combinations thereof.

In an exemplary embodiment, and as can be seen in FIG. 2B, the core 204 comprises an anisotropy that is perpendicular to the disk plane. As can be appreciated, the core 204 may posses an in-plane shape anisotropy with respect to the plane of the disk. However, the in-plane shape anisotropy can not overcome the perpendicular anisotropy so that the magnetization of the ferromagnetic core points perpendicular to the plane of the disk. Assuming that the core 204 comprises a perpendicular anisotropy, perpendicular write fields can change the magnetization direction of the core 204. Of course, this also depends upon the strength and direction of the field applied to the core 204. A data bit is stored in the core 204 and the logical value assigned to that bit is based on the magnetization direction of the core 204. For instance, the upward or downward magnetization direction of the core 204 (relative to the substrate) may correspond to the logical value represented by the bit 108 (e.g., upward magnetization directed away from the substrate may correspond to a logical one and downward magnetization directed toward the substrate may correspond to a logical zero).

As can also be seen in FIG. 2B, the shell 208 may be magnetically coupled to the core 204. Due to the exchange bias effect, the magnetization of core 204 is exchange coupled with the net moment of the antiferromagnetic shell 208 at the interface. The arrows on shell 208 represent the orientation of the net magnetic moment of the antiferromagnetic shell at the interface and also the orientation of one of the magnetic sublattices in the shell. Here, we assume a ferromagnetic interface exchange coupling, meaning the magnetization of the ferromagnetic core and the net magnetic moment of the antiferromagnetic shell at the interface prefer to align parallel to each other. In the case of antiferromagnetic interface exchange coupling, the magnetization of the ferromagnetic core and the net magnetic moment of the antiferromagnetic shell at the interface prefer to align anti-parallel to each other. Discussion of this invention is based on the ferromagnetic interface exchange coupling. An antiferromagnetic interface exchange coupling would change the relative orientations of the magnetic moments between the core and the shell. But it will not alter the essence of the present invention.

The antiferromagnetic material of the shell 208 helps to stabilize the magnetization configuration at the remanent state due to the exchange coupling between the shell 208 and core 204. However, the shell 208 has little to no overall net moment and, therefore, does not contribute to the media noise.

In accordance with at least one embodiment of the present invention, the shell 208 may be added at the dot 108 boundary. Due to the exchange coupling between the shell 208 and core 204, the antiferromagnetic shell 208 magnetic moment will be aligned with the grain magnetization. This particular feature can be seen in more detail in FIG. 3. However, over a long range, the antiferromagnetic shell 208 has no net moment. Furthermore, due to the pinning between the core 204 and shell 208, the magnetization within the dot 108 is stabilized with more uniform magnetization from dot 108 center to dot 108 edge (i.e., outer boundary of the shell 208). This also helps to reduce the overall media noise.

As described above, there are many different choices of materials that can be used in the core 204 and shell 208. Furthermore, the dimensions of the various elements of the dot 108 can vary depending upon design considerations. In accordance with at least some embodiments of the present invention, the shell 208 thickness should be thin as compared to the entire dot 108 diameter, but it does not have to be extremely thin. Depending upon the choice of material for the antiferromagnetic shell 208, the optimal thickness can vary such that the entire volume of the shell 208 is between about 5% and about 30% of the entire volume of the dot 108. Alternatively, or in addition, the entire dot 108 diameter may range between about 10 nm and about 100 nm and the shell's 208 radial thickness may range between about 1 nm and about 10 nm.

In addition to dimensional considerations, the relative hardness of the core 204 and shell 208 can help in creating a proper coupling field between the elements. In accordance with at least some embodiments of the present invention, the coupling field between the core 204 and shell 208 is greater than a predetermined value determined by uniaxial anisotropy and domain wall energy of the shell 208 but less than the coercivity of the core 204. The coupling field between the shell 208 and core 204 can be determined by measuring the magnetic coupling energy, considering the dimensions and material properties of the shell 204 and core 208, then calculating the coupling field. In accordance with at least some embodiments of the present invention, the hardness of the core 204 is greater than the coupling field on the shell 208. In accordance with one embodiment of the present invention, the core may comprise a hardness of around 5000 Oe and coupling field on the shell 208 may vary from 50 Oe to 1000 Oe.

Figure 3:
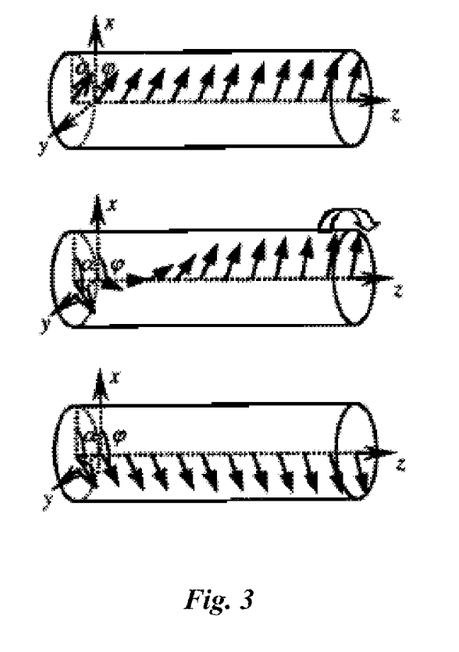
FIG. 3 depicts the magnetic moment in the AFM layer and of reversal process of the AFM moment with the magnetization of the ferromagnetic core.
Figure 4A:
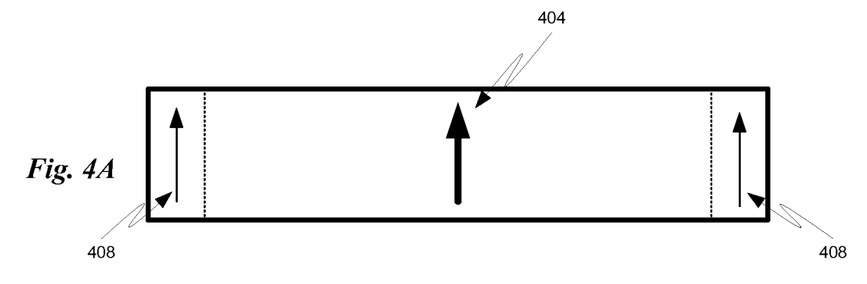
FIG. 4A depicts the orientation of the magnetic field of the various elements of the bit cell prior to having a write field applied thereto.
Figure 4B:
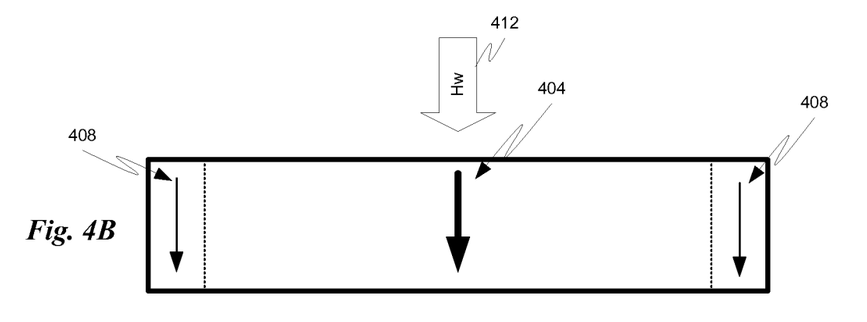
FIG. 4B depicts the orientation of the magnetic field of the various elements of the bit cell while having a write field applied thereto.
Figure 4C:
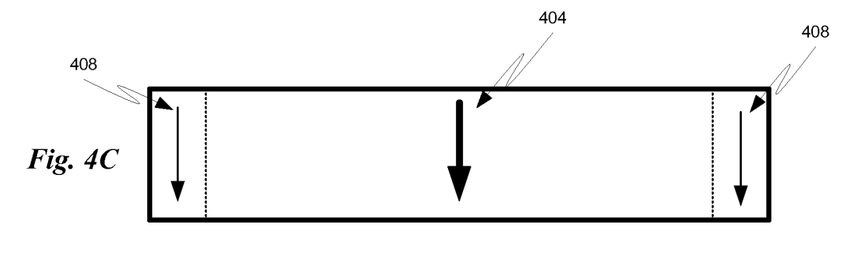
FIG. 4C depicts the orientation of the magnetic field of the various elements of the bit cell after having a write field applied thereto.

The coupling field between the shell 204 and core 208 may be affected by the magnetic and crystalline properties of the shell 204 and core 208 as well as the interface between the core and the shell. Referring now to FIGS. 4 and 4A-C, an exemplary write process on the proposed bit 108 will be described in accordance with at least some embodiments of the present invention. As can be seen at the top of FIG. 3 and in FIG. 4A, the core 204 and shell 208 have an initial magnetization direction 404 and an initial interface net moment 408, respectively, in the absence of a magnetic field. The initial interface net moment 408 also represents the orientation of one of the sublattices in shell 208. As is shown in the middle of FIG. 3 and in FIG. 4B, when a write field 412 is applied to the bit 108 with an opposite magnetization direction than the initial magnetization directions 404 of the core 204, the magnetization direction 404 of the core 204 and the interface net moment and the sublattices of magnetic moments of shell 208 are reversed. The reversal of the whole core-shell structure occurs when the thickness of the antiferromagnetic shell is below a critical value where the interface exchange coupling energy is greater than the uniaxial anisotropy energy or the domain wall energy of the antiferromagnetic shell. This causes the edge magnetization of the antiferromagnetic shell 208 to follow the magnetization of the grain. When the field 412 is removed, as is depicted in the bottom of FIG. 3 and in FIG. 4C, the interface net moment direction 408 of the shell 208 is aligned with the magnetization direction 404 of the core 204. Therefore, the entire core-shell structure is reversed and a data bit is written in to the dot 108. Due to the exchange coupling at the edge, the magnetization of the dot 108 at its boundary will not be tilted and, therefore, will not serve as a nucleation center that would otherwise be the origin of thermal fluctuation and the switching field distribution.

With reference now to FIGS. 5A-5F, an exemplary method of producing a magnetic bit cell array will be described in accordance with at least some embodiments of the present invention. In a first production step depicted in FIG. 5A, a plurality of patterned magnetic dots 508 are provided on a substrate 504. A seed layer 512 may be provided between each magnetic dot 508 and the substrate 504 to promote the growth of the core material with proper crystallinity and texture. In accordance with at least some embodiments of the present invention, the substrate 504 corresponds to a disk or similar type of recording media substrate. Any type of known non-magnetic materials such as aluminum and glass may be used as the substrate 504.

Figure 5A:
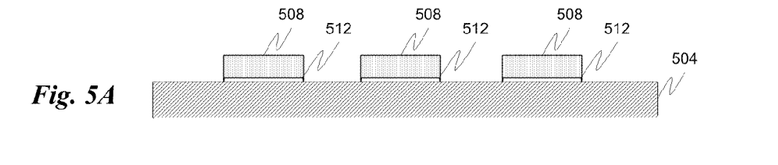
FIGS. 5A-5F depict an exemplary method of producing a magnetic bit cell array.
Figure 5B:
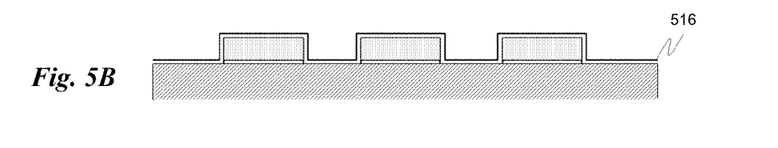

In a second production step depicted in FIG. 5B, a shell or antiferromagnetic layer 516 is deposited over the magnetic dots 508 and the substrate 504. In accordance with one embodiment of the present invention, the shell layer 516 is deposited using known deposition techniques. To reduce bit-to-bit variation the uniformity of the shell thickness needs to be well controlled.

Figure 5C:
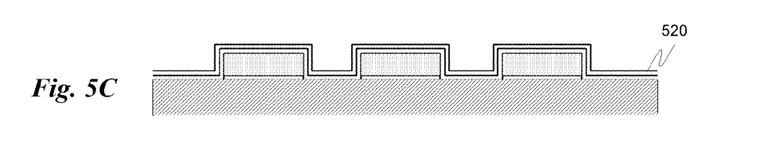

In a third and optional production step depicted in FIG. 5C, a cap layer 520 is provided on the shell layer 516. Again, this deposition may be accomplished by utilizing known deposition techniques such as atomic layer deposition that allows the cap layer 520 to be deposited one layer of atoms at a time, thereby facilitating a controlled deposition of the cap layer 520.

Figure 5D:
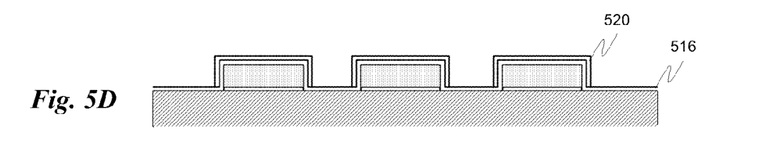

In a fourth production step depicted in FIG. 5D, an ion mill is utilized to partially remove some of the antiferromagnetic layer 516 and the cap layer 520. More specifically, in this partial removal step, the antiferromagnetic layer 516 is expected to be removed entirely from portions where there is no magnetic dot 508. In other words, the spaces between the magnetic dots 508 have the antiferromagnetic layer 516 removed therefrom, with the exception of locations corresponding to the outer radial edge of the dot 508 (i.e., the vertical surfaces of the dot 508). In practice, there may be some remaining of antiferromagnetic layer 516 in the gap region after ion mill. This should not present a problem if the antiferromagnetic layer 516 is sufficiently thin.

Figure 5E:
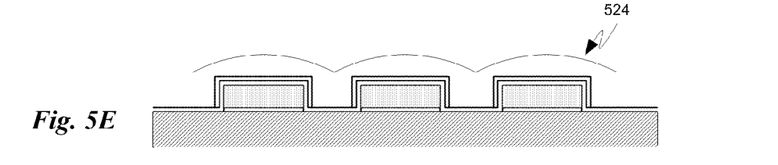

In a fifth production step depicted in FIG. 5E, the gaps or spaces between (and over the top of) the magnetic dots 508 are filled with a non-magnetic filling material 524. The back-filling material can be insulator such as silica or alumina or metallic material such as copper or aluminum. One of the requirements for the back-filling material is to ensure the flatness and smoothness of the disk surface after chemical mechanical planarization (CMP) process that is illustrated in the next step.

Figure 5F:
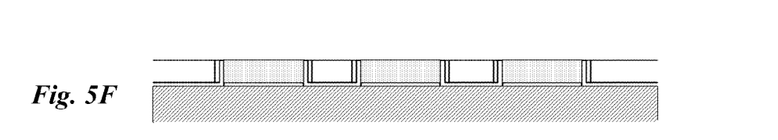

In a sixth production step depicted in FIG. 5F, CMP is used to form the clad magnetic dots 508 with the antiferromagnetic boundary 516. More particularly, in this step the antiferromagnetic material 516 and the cap layer 520 are removed from the top surface of the magnetic dot 508, thereby exposing the top surface of the magnetic dot 508. CMP removes material from uneven topography on a disk surface until a flat (planarized) surface is created. CMP combines the chemical removal effect of an acidic or basic fluid solution with the mechanical effect provided by polishing the surface with an abrasive material. The chemical mechanical planarization system usually has a polishing head that presses the rotating disk against a flexible pad. A wet chemical slurry containing a micro-abrasive is typically placed between the surface of the disk and the pad. The end result of employing the chemical mechanical planarization process is a smooth, uniform surface is realized that substantially coincides with the top surfaces of the magnetic dots 508.

Figure 6:
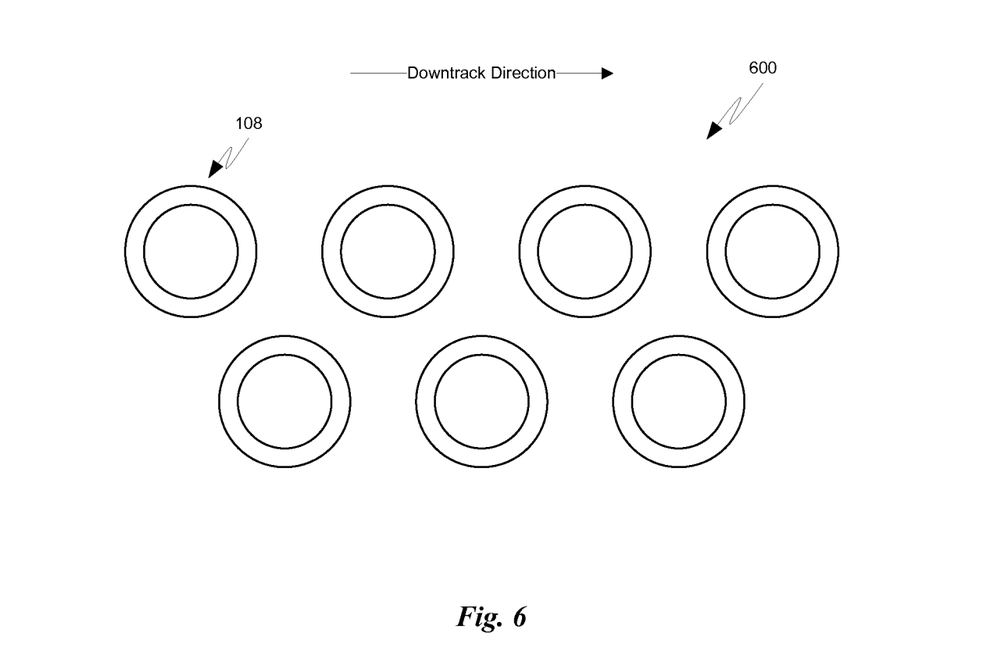
FIG. 6 depicts an exemplary magnetic bit cell array.

Once the production steps have been accomplished, an array of magnetic dots 600 are created on the substrate. As can be seen in FIG. 6, the magnetic dots 108 are substantially evenly spaced in the down track direction. Each magnetic dot 108 comprises a magnetic core and antiferromagnetic shell for stabilizing the magnetic moment of the dot 108 at its edges. Each dot 108 in the array of magnetic dots 600 is capable of storing separate data bits and a large number of data can be stored in a relatively dense area (e.g., its areal density may be greater than 1 Terabit/in$^2$.

The foregoing discussion of the invention has been presented for purposes of illustration and description. The foregoing is not intended to limit the invention to the form or forms disclosed herein. In the foregoing description for example, various features of the invention have been identified. It should be appreciated that these features may be combined together into a single embodiment or in various other combinations as appropriate for the intended end use of the band. The dimensions of the component pieces may also vary, yet still be within the scope of the invention. This method of disclosure is not to be interpreted as reflecting an intention that the claimed invention requires more features than are expressly recited in each claim. Moreover, though the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g., for improving performance, achieving ease and\or reducing cost of implementation. Rather, as the following claims reflect, inventive aspects lie in less than all features of any single foregoing disclosed embodiment. Thus, the following claims are hereby incorporated into this Detailed Description, with each claim standing on its own as a separate preferred embodiment of the invention.

What is claimed is:

1. A plurality of magnetic data stacks on a substrate, the magnetic data stacks comprising:
   a magnetic core with an initial magnetization direction; and
   an antiferromagnetic shell, with an interface net moment at an interface with the magnetic core;
   wherein:
   the magnetic core and the antiferromagnetic shell being so configured that when a field opposite to the direction of the initial magnetization direction applied to a magnetic data bit is removed, a direction of an interface net moment is aligned with a direction of the magnetization of the magnetic core; and
   wherein the direction of the magnetization of the magnetic core is substantially perpendicular to the planar surface of the substrate.

2. The stack of claim 1, wherein the antiferromagnetic shell is located in proximity to an outer perimeter of the magnetic core.

3. The stack of claim 1, wherein the magnetic core comprises a magnetically hard material and wherein the antiferromagnetic shell comprises an antiferromagnetic material, wherein there is a magnetic coupling between the magnetic core and the antiferromagnetic shell such that when a magnetic orientation of the magnetic core is altered a magnetic orientation of the antiferromagnetic shell also alters in response thereto.

4. The stack of claim 1, wherein a coupling field exists between the magnetic core and the antiferromagnetic shell that is greater than a predetermined value determined by uniaxial anisotropy and domain wall energy of the antiferromagnetic shell and less than a coercivity of the magnetic core.

5. The stack of claim 1, wherein the stack comprises a diameter of between about 10 nm and about 100 nm.

6. The stack of claim 1, wherein the antiferromagnetic shell comprises a radial thickness of between about 1 nm and about 10 nm.

7. The stack of claim 1, wherein a volume of the antiferromagnetic shell is between about 5 percent and about 30 percent of a volume of the stack.

8. The stack of claim 1, wherein the magnetic core comprises a material selected from the group consisting of CoCr, CoCrB, CoPt, CoPtB, CoPtBO, FePt, FePeCu, FePeCuB, FePeC, and their oxidization and wherein the antiferromagnetic shell comprises a material selected from the group consisting of NiMn, FeMn, PtMn, and NiO.

9. A magnetic feature array comprising the plurality of stacks of claim 1.

10. A data storage disk comprising the plurality of stacks of claim 1.

11. A data storage apparatus, comprising:
    a substrate; and
    a plurality of magnetic features, at least one of which is surrounded by a shell comprising an antiferromagnetic material, wherein a magnetization of the at least one magnetic feature is exchange coupled with an interface net moment of the antiferromagnetic shell due to an exchange bias effect,
    wherein the magnetic feature and the antiferromagnetic shell being so configured that when a field opposite to the direction of the initial magnetization direction applied to a magnetic data bit is removed, a direction of an interface net moment is aligned with a direction of the magnetization of the magnetic feature;
    wherein said magnetization of said magnetic feature is substantially perpendicular to a planar surface of said substrate.

12. The data storage apparatus of claim 11, wherein the plurality of magnetic features comprise a magnetically hard material and wherein the shell comprises an antiferromagnetic material, wherein there is a magnetic coupling between the at least one magnetic feature and the shell such that when a magnetic orientation of the at least one magnetic feature is altered a magnetic orientation of the shell also alters in response thereto, but a magnetic orientation of an adjacent core or shell does not change, and wherein a coupling field exists between the at least one magnetic feature and the shell that is greater than a certain value determined by uniaxial anisotropy and domain wall energy of the shell and less than a coercivity of the at least one magnetic feature.

13. The data storage apparatus of claim 11, wherein a coupling field exists between the at least one magnetic feature surrounded by the antiferromagnetic shell and the antiferromagnetic shell, the coupling field is greater than a predetermined value determined by uniaxial anisotropy and a domain well energy of the shell and less than a coercivity of the at least one magnetic feature surrounded by the shell.

14. The data storage apparatus of claim 11, wherein the magnetic features comprise a diameter of between about 10 nm and about 100 nm.

15. The data storage apparatus of claim 11, wherein a volume of the shell is between about 5 percent and about 30 percent of a volume of the at least one magnetic feature surrounded by the shell.

16. The data storage apparatus of claim 11, wherein the magnetic features comprise a material selected from the group consisting of CoCr, CoCrB, CoPtB, CoPtBO, FePt, FePeCu, FePeCuB, FePeC, and their oxidation and wherein the shell comprises a material selected from the group consisting of NiMn, FeMn, PtMn, and NiO.

17. The data storage apparatus of claim 11, further comprising:
   a non-magnetic material between each of the plurality of magnetic features.

18. The data storage apparatus of claim 11, wherein the features comprise a plurality of cores.

* * * * *